United States Patent [19]
Hoopes

[11] 3,939,459
[45] Feb. 17, 1976

[54] DIGITAL SIGNAL LINEARIZER
[75] Inventor: Howard S. Hoopes, Hatfield, Pa.
[73] Assignee: Leeds & Northrup Company, North Wales, Pa.
[22] Filed: Jan. 9, 1974
[21] Appl. No.: 432,130

[52] U.S. Cl...... 340/347 NT; 73/362 AR; 324/99 D; 340/347 AD
[51] Int. Cl.².................. H03K 13/02; H03K 13/20
[58] Field of Search............... 340/347 AD, 347 NT; 179/15 AV; 324/99 D; 73/362 AR

[56] References Cited
UNITED STATES PATENTS

| | | | |
|---|---|---|---|
| 3,349,390 | 10/1967 | Glassman | 340/347 NT |
| 3,617,885 | 11/1971 | Wheable | 340/347 AD X |
| 3,662,163 | 5/1972 | Miller et al. | 340/347 AD X |
| 3,668,691 | 6/1972 | Sergo | 340/347 AD |
| 3,685,048 | 8/1972 | Pincus | 340/347 AD |
| 3,686,665 | 8/1972 | Elias et al. | 340/347 AD |
| 3,699,318 | 10/1972 | Underkoffler et al. | 340/347 AD X |
| 3,701,145 | 10/1972 | Bergin | 340/347 NT |
| 3,793,630 | 2/1974 | Meijer | 340/347 NT |
| 3,824,585 | 7/1974 | Meijer | 340/347 NT |

OTHER PUBLICATIONS
Kollataj et al., "INTEGRATED CIRCUITS - - -," Electronics, 3/1968, pp. 112-121.

Johnson, "DIGITAL SYSTEM - - -," Electronics, 3/1965, pp. 102-107.

Millman and Taub, "Pulse and Digital Circuits," McGraw-Hill Book Co., 1956, pp. 323-327.

Primary Examiner—Thomas J. Sloyan
Attorney, Agent, or Firm—William G. Miller, Jr.; Raymond F. MacKay

[57] ABSTRACT

A digital signal linearizer for obtaining a linear digital output from a non-linear input. The output voltage of a thermocouple is converted to a train of pulses by a dual slope analog to digital converter. The number of pulses in the pulse train is proportional to the voltage and is linearized by a pulse rate multiplier programmed to vary over successive ranges of pulse counts corresponding to linear segments approximating the non-linear characteristic relating temperature and voltage. The linearized pulse train out of the multiplier is counted and displayed directly in temperature units.

2 Claims, 3 Drawing Figures

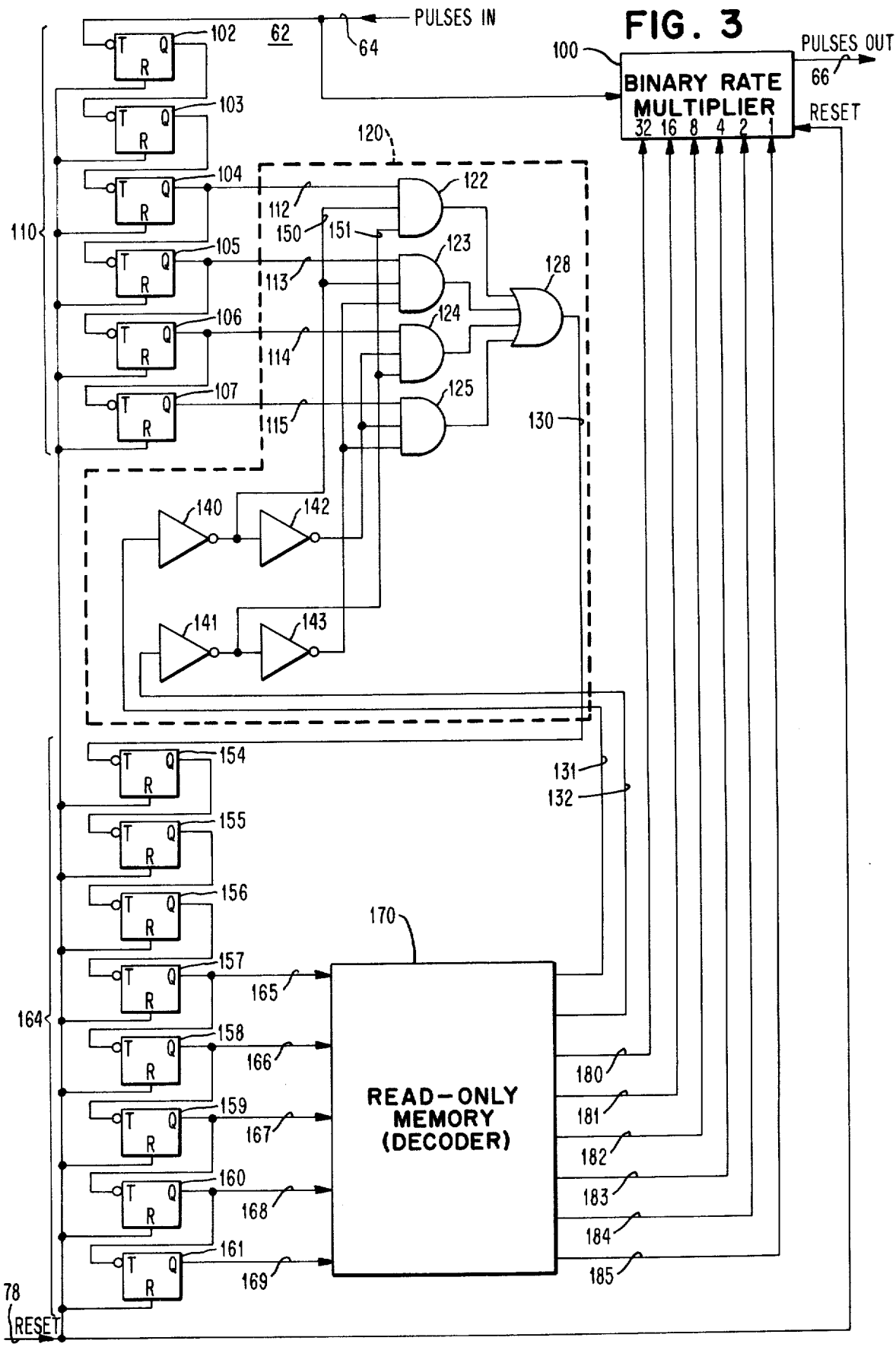

DIGITAL SIGNAL LINEARIZER

BACKGROUND OF THE INVENTION

This invention relates to signal converting apparatus. More specifically, it relates to an apparatus for converting an analog or digital signal which varies in a non-linear relationship to the value of a particular variable to a digital signal which varies in a linear relationship.

The measurement and display of variables such as temperature, pressure, density, etc., are frequently desired in the form of a digital display. In carrying out these measurements, it is sometimes necessary to use sensing elements which provide an electrical signal (such as voltage or current) the magnitude of which varies in response to the quantity being measured. Thus, for example, thermocouples may be used to measure temperature in that they produce an output voltage which is related to temperature. That voltage can be suitably processed and displayed in digital form to give a direct indication of the magnitude of that particular variable. The thermocouple, however, as with many other sensors, produces a voltage output which is non-linearly related to the magnitude of the quantity being measured. Thus, a plot of the output voltage of the thermocouple against the temperature being measured by the thermocouple is not a straight line over the normal range of interest.

Various means have been utilized for linearizing the digital signals provided, upon conversion of the analog output of the thermocouple, for example, to digital form so as to provide a digital display which is directly readable as temperature in degrees Fahrenheit or Centigrade. An example of one form of linearization is to be found in U.S. Pat. No. 3,686,665 to Elias et al, assigned to the assignee of this invention. In the disclosure of that patent there is set forth a method which utilizes an identification cycle which identifies the instantaneous value of the input, identifies a particular segment of the function on which that instantaneous value of the input is located, and identifies one or more count modifiers corresponding to the identified segment of the function. A register is then cleared and the readout cycle is begun during which a digital count accumulates in the register and is modified by one or more count modifiers to give the digital output in linearized form. That system has as a disadvantage, the requirement of using alternating identification and readout cycles, thus requiring a longer time period to accomplish the linearization than is the case with the present invention.

Other forms of linearization which have been used include those which utilize the count of pulses out of a frequency divider as a basis for modifying the division factor. Such systems are inherently more difficult to program for different ranges and different primary measuring elements.

SUMMARY OF THE INVENTION

It is therefore a general object of this invention to provide an improved electronic digital signal linearizer. It is a more specific object of this invention to provide a signal conversion apparatus which provides an output pulse train which can be counted and displayed as a digital quantity which is linearized with respect to the quantity being measured where the quantity being measured is being measured by a sensing element which produces an electrical signal whose magnitude is not linearly related to the magnitude of the quantity itself.

In accordance with the present invention there is provided a digital signal linearizer for linearizing a pulse count which has a non-linear relationship to a particular variable so that there may be presented to an output counter a pulse count which is linearly related to the variable. The linearizer comprises a programmable multiplier operable to receive the input train of pulses to be counted and for providing an output train of pulses which represents a modification of the input train in accordance with a control signal. The control signal is produced by a counter-decoder which is operable to receive the input train of pulses and to provide said control signal to said multiplier so that the control signal varies with the input train count in a manner which will linearize, by means of the multiplier, the pulse count so that the output pulse train has a linear relationship to the variable.

BRIEF DESCRIPTION OF THE DRAWINGS

FIG. 3 is a block diagram showing a preferred form of the linearizer shown as a single block in FIG. 2.

DESCRIPTION OF THE PREFERRED EMBODIMENTS

Figure 1:
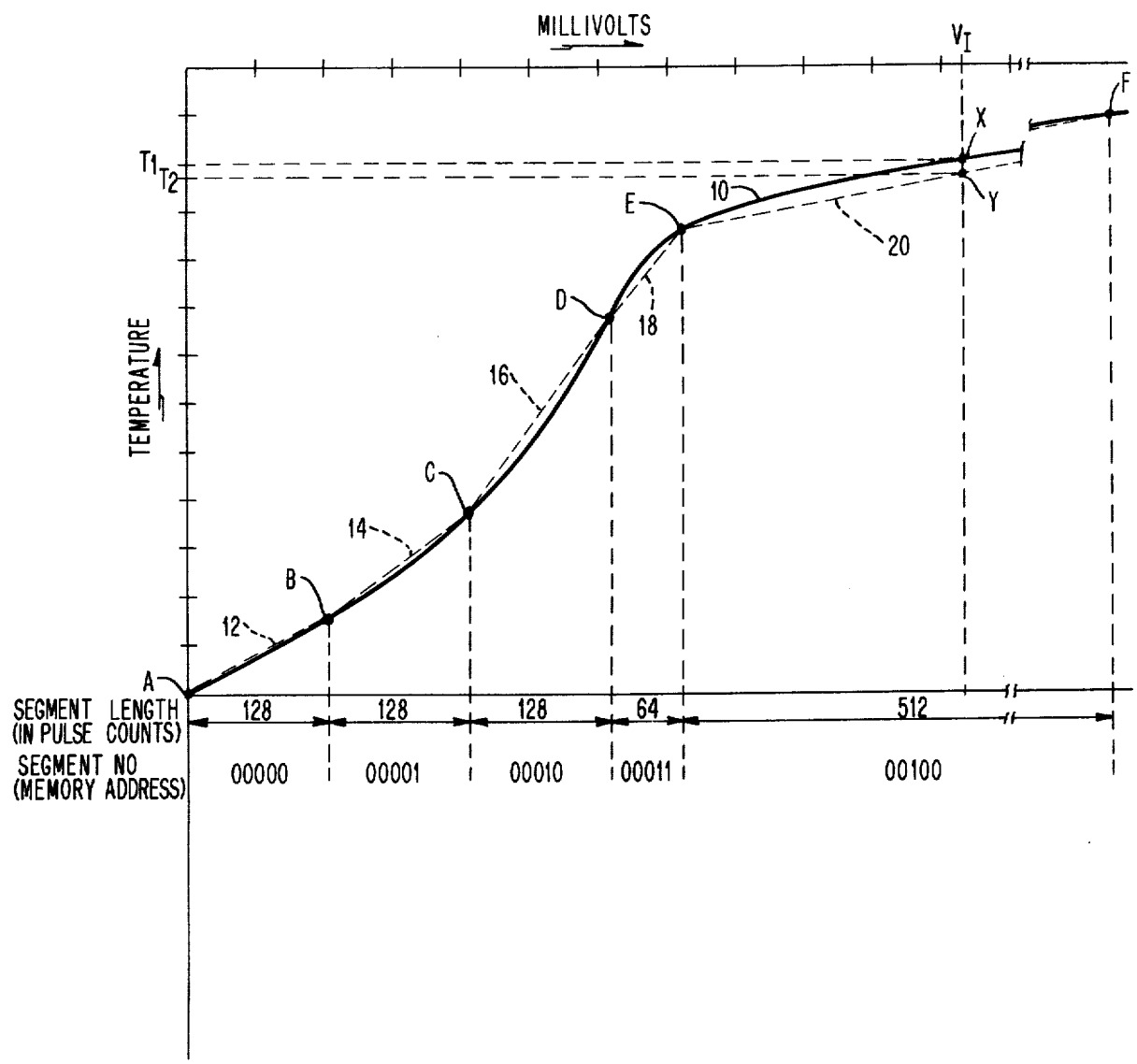
FIG. 1 is a plot showing the non-linear relationship between temperature and the voltage produced by a thermocouple.

In FIG. 1, the curve 10, shown as a solid line, represents the temperature-millivolt relationship of a conventional thermocouple with temperature being plotted linearly along the ordinate and the output voltage of the thermocouple being plotted linearly along the abscissa. It will be evident that the temperature-voltage function as illustrated by characteristic curve 10 is non-linear in form.

In order to linearize the relationship between temperature and the voltage output of the thermocouple in millivolts, the curve 10 has been divided into sections such as the first section between the breakpoints A and B which are then connected by a straight line shown in dashed form as line 12 to represent a linear relationship between temperature and voltage over the span between those breakpoints. Similarly, that portion of the characteristic which follows breakpoint B up to the indicated breakpoint C can be linearized by the straight line segment shown connecting the breakpoints B and C and identified by the reference character 14. Following breakpoint C, a longer section of the characteristic up to breakpoint D may be represented by the line segment shown as dashed line 16 whereas a shorter segment 18 follows breakpoint D and connects with breakpoint E. In the curve of FIG. 1 a long segment connects breakpoints E and F and is shown as the dashed line 20, which linearizes that portion of the characteristic. From the above it will be evident that the thermocouple characteristic of FIG. 1 has been divided into five linear segments which may be considered as replacing the non-linear characteristics for the necessary degree of accuracy required for the measurement.

Figure 2:
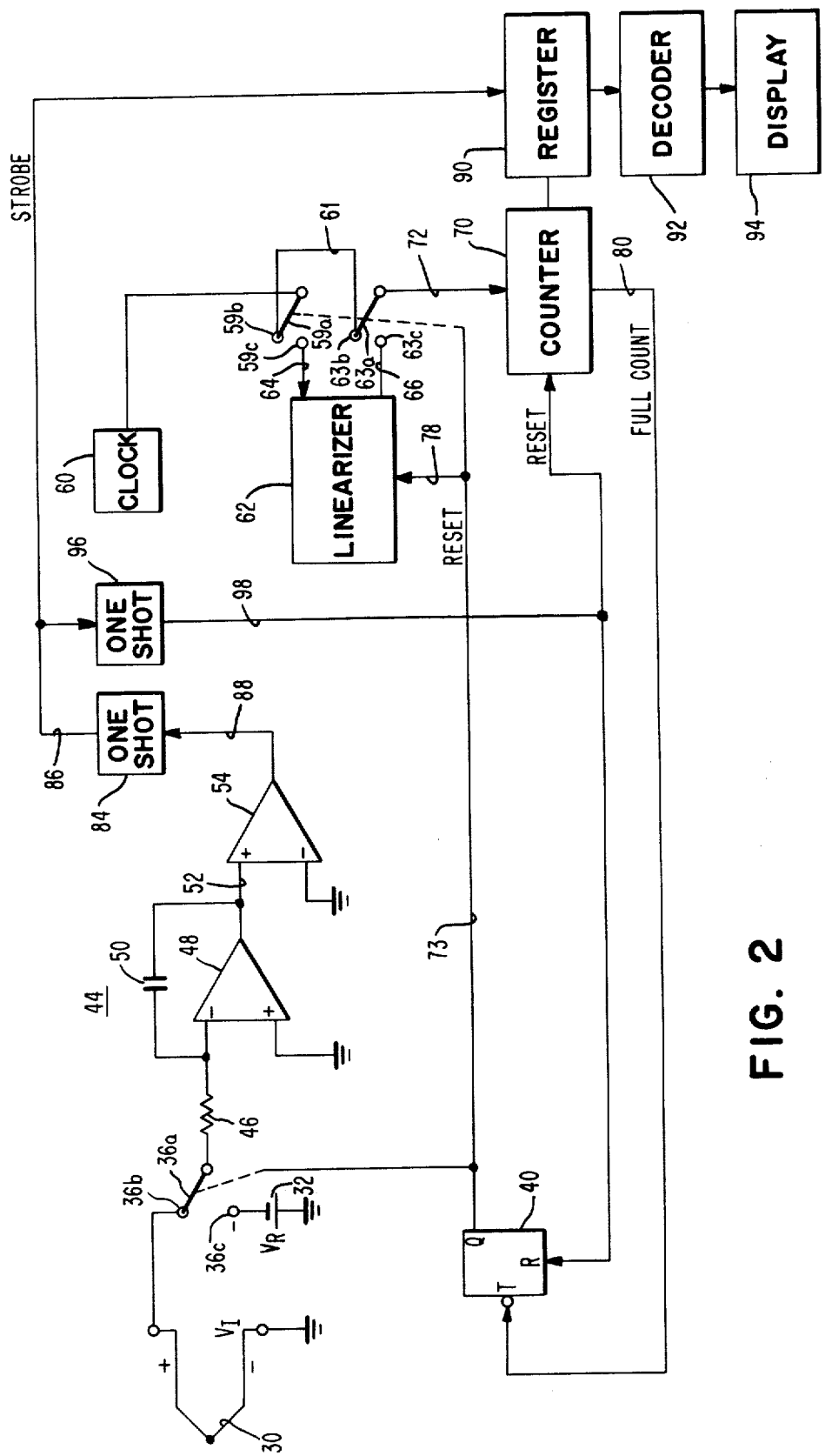
FIG. 2 is a block diagram illustrating a dual slope analog to digital converting system which utilizes a linearizer.

In FIG. 2 there is shown an analog to digital converter of the type generally known as a dual slope ADC in which there is incorporated a linearization to provide a display in terms of temperature in response to measurements made by a thermocouple. Thus, the thermocouple 30 provides the input voltage $V_I$ which is compared to a reference voltage $V_R$, such as that supplied by the battery 32 in the manner characteristic of dual slope analog to digital converters in order to produce a digital signal which in turn actuates a digital display indicative of the temperature measured by the thermocouple 30. The dual slope analog to digital converter of FIG. 2 is one form of converter which can be used advantageously with the digital signal linearizer of the present invention. It produces, during the measuring portion of its conversion period, a pulse train from a gated clock source with the number of pulses in the pulse train being directly proportional to the voltage output of thermocouple 30 ($V_I$). The particular form of converter shown in FIG. 2 will now be described in more detail as an example of one of the uses of the digital linearizer.

It will be assumed that the input switching means shown in FIG. 2 has a movable contact 36a which is in contact with fixed contact 36b (as shown) when the output of the flip-flop 40 (Q) indicates that the flip-flop has been reset and that the switch contact 36a will be operated to be in contact with fixed contact 36c upon the triggering of the flip-flop 40.

A specific means of operating the switch contact 36 is not shown. The form of such a means will depend upon the form which the switch takes. It could, for example, be a form of switch operator which would mechanically operate the movable contact 36a or the switch could be in the form of an electronic switch. In that case, the output of the flip-flop (Q) would electronically switch the input to an integrator 44 from the input voltage $V_I$ to the reference voltage $V_R$ so that the integrator 44 would, when the flip-flop has been reset, receive an input from the thermocouple 30 whereas the input to the integrator 44 would be from the reference voltage supplied by battery 32 upon a triggering of flip-flop 40.

The integrator 44 is shown as including an input resistor 46 which is connected to the inverting input of an operational amplifier 48 whose output is connected through the feedback capacitor 50 to the inverting input so as to provide the integrating function. The non-inverting input of the amplifier 48 is connected to ground.

With the input switching means making the circuit connections shown in FIG. 2 the voltage produced by the thermocouple 30, $V_I$, is integrated by the integrator 44 to produce at the output line 52, of the integrator 44, a negative potential of constantly increasing magnitude. That negative potential is introduced as an input to the non-inverting input of the differential amplifier 54 which serves in this circuit as a comparator. The inverting input of amplifier 54 is, as shown, connected to ground. The output of the comparator 54 will also be a negative going potential while the movable switch contact 36a is connected to the contact 36b.

During the period that switch contact 36a is connected to the contact 36b (the sampling period of the conversion cycle) the clock 60 is continually supplying clock pulses through a gating means directly to a counter 70 whereas during the period when contact 36a is connected to contact 36c (the measuring period of the cycle) the clock pulses are being gated through the linearizer 62 by way of the pulse input line 64 so as to produce on the pulse output line 66 a train of pulses which is related to the input train on line 64 in a manner to be described subsequently. The linearizer 62 is thus effective, during the measuring period of the cycle of the dual slope converter in FIG. 2, to supply a train of pulses on line 66 which will have a linear relationship to the temperature being measured by thermocouple 30. The gating means for gating the clock pulses selectively either directly to the counter 70 or through linearizer 62 to counter 70 are shown in FIG. 2 as including a linearizer input switch and a linearizer output switch. The input switch has a movable contact 59a which is shown in contact with a fixed contact 59b which connects the clock 60 through lead 61 to the fixed contact 63b which is shown in contact with movable contact 63a which connects to counter 70 through lead 72. Thus, the switch configuration for the sampling period is shown in FIG. 2.

During the measuring period of the conversion cycle of the ADC the movable contacts 59a and 63a will be actuated to respectively contact the fixed contacts 59c and 63c. That arrangement of the linearizer switches will, of course, cause the clock pulses to be introduced into the linearizer over line 64 and the output pulses from the linearizer on line 66 will then go to counter 70.

The switching of the movable contacts 59a and 63a from the positions shown in FIG. 2 for the sampling period to the other state for the measuring period will occur in response to a signal on line 73 from flip-flop 40 indicating that 40 has been triggered. That same output from flip-flop 40 is introduced into linearizer 62 as a reset signal on line 78 so that the linearizer is reset for the measuring portion of the analog to digital conversion period.

The pulse train from the clock through lines 61 and 72 during the sampling period is counted by the counter 70 until a full count has been reached, at which time a signal appears on line 80 showing the counter has reached its full count and, of course, the counter goes to its zero state. The signal on line 80 is introduced as the triggering input to flip-flop 40 which is effective to cause switch contact 36a to contact the fixed contact 36c and is also effective to cause the switch contacts 59a and 63a to contact the fixed contact 59c and 63c to insert linearizer 62 between the clock and the counter 70 as mentioned. At the same time, the linearizer is reset by the introduction of the reset signal on line 78. The analog to digital converter of FIG. 2 is then in the measuring period of the conversion cycle of the dual slope converter since the input to the integrator 44 is now a voltage $V_R$, which is a reference voltage of opposite polarity to that introduced to the integrator during the sampling period. As the measuring period progresses the integrator output on line 52 becomes less negative and upon crossing ground potential the comparator 54 will cause the one shot 84 to produce a pulse output on line 86 as a result of its output signal on line 88 indicating that the potential on line 52 has crossed the ground potential in a positive going direction.

During the period before the one shot 84 produces a pulse on line 86, the counter 70 accumulates from the clock 60 a count which is related to the period of time required to return the integrator output on line 52 to ground potential from its peak negative value which was reached at the time when the counter 70 reached a full count as a result of counting the pulse train on line 66 during the sampling period. The count in counter 70 at the time of the appearance of the pulse from one shot 84 on line 86 is thus directly related to the magnitude of the input voltage $V_I$ since the integrator 44 integrated to the negative peak over a fixed period of time and then integrated back to a ground potential along a fixed slope in accordance with the principles followed by dual slope analog to digital converters. Thus the count in counter 70 is indicative of the temperature measured by the thermocouple 30, for the count accumulated during the mesauring period was linearized to be related directly to temperature.

The strobe pulse appearing on line 86 is introduced into register 90 causing a readout of the count from counter 70 which results in a subsequent decoding of the count in decoder 92 and a display of the temperature or any other variable being measured in the display device 94.

The output of the one shot 84 on line 86 is also effective as an input to the one shot 96 to produce a reset signal on the output line 98 which serves to reset the counter 70 after the accumulated count has been properly stored in the register 90 and also to begin a new conversion cycle by switching the switch contacts 36a, 59a and 63a to the positions shown in FIG. 2.

It will be evident from the above description of the analog to digital conversion that the pulse train produced on input line 64 to linearizer 62 between the triggering of flip-flop 40 and the production of an output signal from one shot 84 will contain pulses in number directly proportional to the input signal $V_I$ such as the millivolt output of thermocouple 30. Thus, the abscissa of the plot in FIG. 1 is linearly calibrated in regard to the number of pulses from the clock during the measuring period. Thus, segment 12 when projected onto the abscissa is 128 pulses long as are segments BC and CD while DE is 64 pulses long and EF is 512 pulses long. The consecutive pulse counts corresponding to successive segments of the linearized characteristic can be considered a predetermined range of pulses of the total count whatever the extent of the total count during a measuring period. Each of the ranges corresponds to a line segment which establishes the linear relationship between the number of pulses and each unit on the ordinate, or in other words, each unit of temperature.

The linearization carried out by the linearizer 62 can be best understood by reference to FIG. 3 where the pulse input line 64 receives an input pulse train from the clock with the number of pulses in the train being related to a variable such as millivolts. The input pulse train must be modified by the binary rate multiplier 100 so as to provide on the output line 66 an output pulse train which will, during the particular period that the pulses on line 66 are being counted, provide a pulse count having a linear relationship to the particular variable represented by the pulse count in the period they are supplied on line 64. The manner in which the linearization is accomplished will be more fully understood by a description of the operation of the linearizer of FIG. 3.

The pulse train appearing on input line 64 is introduced to the trigger input of flip-flop 102 which is the first of a string of flip-flops 102–107 which make up a ripple-through counter 110 providing a 4-bit output on the output lines 112–115 as inputs to the segment length selector 120. A signal on any one of the output lines 112–115 when representing a binary 1 indicates an associated range of pulses may be selected as the span of the line segment of FIG. 1 being followed in the linearization.

The segment length selector 120 is used for the purpose of selecting the range of pulses, or in other words, the length of the linear segment such as segment AB of FIG. 1, which is shown as being 128 pulses long.

The segment length selector 120 includes the four AND gates 122–125 which, respectively, receive as one of their inputs the signal on one of the output lines 112–115 from the counter 110 and which provide on the output lines, inputs to the OR gate 128, whose output on line 130 will be indicative of the segment length selected for purposes of linearization.

The selection of the segment lengths by means of the AND gates 122–125 is effected by the 2-bit segment length selecting input supplied to the selector 120 on lines 131 and 132. The signals on those segment select lines may be any one of the four possible combinations 00, 01, 10 or 11. The segment length selecting bits on lines 131 and 132 are effective through the inverting amplifiers 140–143 to provide the necessary gating signals to the AND gates 122–125 for selection of the appropriate range or segment in coordination with the signals on output lines 112–115 from the counter 110 to select the desired segment length or range.

It will be evident from the arrangement of binary counter 110 that a pulse will appear on line 112 for every 8 pulses received on line 64, whereas, a pulse will appear on line 113 for every 16 pulses on line 64. Similarly, on lines 114 and 115, respectively, a pulse will appear for every 32 pulses and every 64 pulses on line 64. Thus, if a "select" signal appears on line 150 as well as line 151 which will be effective with the appearance of an output signal representing a binary 1 on line 112 indicative of 8 pulses received on line 64, then the AND gate 122 will be enabled to produce a signal to OR gate 128 and will provide a signal on line 130 in the form of a pulse which will appear for every 8 pulses received on line 64. Thus, there is made a pulse length selection in response to the signals on lines 131 and 132 as necessary to provide the above mentioned signals on lines 150 and 151 at the output of amplifiers 140 and 141.

There will, thus, appear under the previously mentioned circumstances a trigger signal to the flip-flop 154 which is in turn connected with the flip-flops 155–161 to form a binary counter 164 which provides a 5-bit output on lines 165–169 as an address to a read-only memory 170. If, for example, as mentioned above a pulse appears on line 130 for every 8 pulses appearing on line 64, there will then appear the leading edge of a pulse on line 165 for every 64 pulses received on line 64. Due to the interposed flip-flops 154–157 between line 130 and line 165 a signal may appear on line 165 for every 128 pulses received on line 64 if the segment length selector bits on lines 131 and 132 select the range or segment length associated with counter output line 113. Likewise, a selection by the selector signal on lines 131 and 132 which will enable the AND gate 124 to be effective to produce on line 165 a signal for every 256 pulses on line 64 indicating the selection of a segment length corresponding to 256 pulses. There can similarly be selected a range or segment length of 512 pulses, when for example, the bits on the segment select line 115 coordinate with signals from amplifiers 142 and 143 for the appropriate gate 125.

The 5-bit address input to the read-only memory 170, which acts as a decoder, is shown as appearing on lines 165–169 as an output from counter 164. That address establishes the slopes of the several segments for the characteristic shown in FIG. 1. The address is a 5-bit binary number as shown along the abscissa as appearing at the particular segments AB, BC, CD, DE, and EF. For each combination of address bits on the lines 165–169 representing the segment number there is produced at the output of the decoder shown as a read-only memory 170 on the control lines 180–185, a 6-bit binary signal which serves as a control signal for the binary rate multiplier 100 and there is supplied at the same time, selection bits on lines 131 and 132 for selecting the length of the range of pulses from the clock over which a particular segment of the characteristic is effective.

Each of the input lines supplying the control signal to the binary rate multiplier 100 has the bits appearing on those lines weighted differently, thus, a particular signal level representing a bit on line 180 is effective to provide at the pulse output 66, 32 pulses for each 64 input pulses on line 64. Likewise, the appearance of a signal level indicating bits on lines 181–185 are respectively effective to produce 16, 8, 4, 2 and 1 pulse output on line 66 for every 64 pulses in on line 64. It will, therefore, be evident that the pulse output on line 66 for every 64 pulses in on line 64 can range all the way from 1 up to 63 pulses, the latter of which would be the situation when all the lines 181–185 are at a level indicating a bit in the binary control signal for the multiplier 100.

Thus, the multiplier 100 multiplies the number of pulses in by the factor (N/64) where N is the weighted total of the binary digits present in the control signal to the multiplier.

Upon the occurrence of a reset signal into the linearizer as, for example, on the reset line 190 all of the flip-flops in the counter string 110 as well as count string 104 will be reset as will the binary rate multiplier. Following a reset pulse on line 78 the linearizer of FIG. 3 is then in condition for linearization of the next sample, or in other words, the next series of pulses supplied on line 64.

If, for example, the thermocouple 30 of FIG. 2 is responding to a temperature $T_1$ as shown along the ordinate of the characteristic curve of FIG. 1, the input to the integrator 44 will be a voltage equal to $V_I$ as shown along the linear millivolt calibration of the abscissa in FIG. 1. Thus, the point X on the characteristic 10 will be effective to define the measurement parameters. Since the temperature $T_1$ will represent a fairly high temperature on the range shown in FIG. 1, the integrator 44 will produce on its output line 52 a large negative signal at the end of the sampling period, that is, at the time there appears a full count of 4000 pulses, for example, in the counter 70 and hence a signal on line 80 to trigger the flip-flop 40. With the high value for the output on line 52 resulting from the sampling of the temperature $T_1$, the period during which it is necessary to integrate the reference voltage $V_R$ to bring the signal on line 52 back to zero potential will be great, and therefore, a considerable number of clock pulses will form the input pulse train received by the linearizer 62 to accumulate a count in the counter 70 indicative of the temperature $T_1$. The total number of pulses from clock 60 which are received by the linearizer 62 during that measuring period of the dual slope ADC cycle will be proportional to the number of millivolts which appeared at the input ($V_I$) during the sampling period.

As the pulses are received at the linearizer from the clock 60 the control signal to the binary rate multiplier will vary sequentially from that which is applicable to the range of pulses spanned by segment 12 to that which is applicable respectively to the ranges consecutively spanned by segments 14, 16, 18 and 20. Thus, at the beginning of the measuring period the initial 128 pulses define the length of the first segment 12, since the address to the read-only memory, namely 00000, supplied on lines 165–169 produces an output on the segment length select lines 131 and 132 which will enable AND gate 123 so that the address to the read-only memory 170 will change by one count after 128 pulses have been received on line 64.

During the period when the initial 128 pulses are being received on line 64, the binary rate multiplier is receiving from the read-only memory on lines 180–185 a 6-bit binary control signal 100000 which may, for example, cause 32 pulses to be put out on line 66 for every 64 pulses received on line 64. After 128 clock pulses have been received on line 64 the address to the read-only memory will be increased by one count to 00001 and the next segment will be selected. In the example shown in FIG. 1, that segment likewise has a length of 128 counts which is spanned by the linear segment 14. Since the linear segment 14 has a steeper slope than linear segment 12, the output of the read-only memory 170 on lines 180–185, which provides the 6-bit binary control signal to the binary rate multiplier 100, may be increased by several counts to 100100, for example, if a signal representing a binary one has appeared on line 180 and line 183 with the other lines 181, 182, 184 and 185 being at levels representing zero. With such a control signal there will be a pulse output of 36 pulses for each 64 pulses in on line 64 to the binary rate multiplier.

After the second group of 128 pulses have been received by the line 64 the segment number counter will then change the address of the read-only memory on lines 165–169 by one count to 00010 so that it will represent the binary segment number shown in FIG. 1 as being applicable to the binary segment 16 of the characteristic. Since this segment is 128 pulses long the AND gate 123 continues to be enabled by the segment length select signals on lines 131 and 132, however, the control signal to the binary rate multiplier is changed to reflect the much steeper slope of the segment 16 so that the control signal on lines 180–185 may, for example, represent an input to the binary rate multiplier 100 which will provide an output of 48 pulses for every 64 pulses received on line 64. The control signal will then be 110000.

After the third group of 128 pulses has been received on line 64, or in other words, a total of 384 pulses, the segment number counter 164 is effective to provide on the address lines 165–169 the binary segment number address 00011 shown in FIG. 1 as applying to the segment 18. Since that segment desirably has a length of only 64 pulses the appearance of that segment number on the address lines causes a change in the signal appearing on lines 131 and 132 to that signal combination necessary to enable gate 122 of the segment length selector. Likewise, the address lines 165–169 are effective during that period of 64 pulses to provide on lines 180–185 a control signal which is effective to cause the binary rate multiplier to provide a decreasing number of pulses for every 64 pulses into the linearizer since the segment 18 obviously has a decreasing slope as compared with the segment 16. Thus, over the span of segment 18 the binary rate multiplier may put out 33 pulses for every 64 pulses in on line 64 in response to a control signal of 100001.

At the end of the fourth segment in this characteristic, namely, after having received a total of 448 pulses, the segment number counter produces an address 00100 on lines 165–169 to the read-only memory 170. That binary address is effective to cause the signal on lines 131 and 132 to enable the gate 125, thus selecting a segment length of 512 pulses. Over the range of those 512 pulses the control signal appearing on lines 180–185 has a considerably diminished slope as compared with that of segment 18 as is evidenced by the slope of segment 20, thus, the control signal to the binary rate multiplier may, for example, be 010000 to cause that unit to put out on line 66 a total of 16 pulses for every 64 pulses received on line 64.

Since the point X on the characteristic 10 is located about half way between the beginning and end of the last segment (512 pulses in length) it will be assumed that it represents an accumulation of 256 pulses after the end of the fourth segment, or in other words, 256 pulses into the fifth segment, making a total accumulation of 704 pulses from the beginning of the measuring period. Those 704 pulses will be effective to bring us to a point Y on the linear segment 20 which will correspond to a temperature $T_2$ with the difference between $T_2$ and $T_1$ representing the temperature error due to linearization as accomplished by the approximation of characteristic 10 with the segments 12, 14, 16, 18 and 20.

While the above description is given by way of example only, it should be pointed out that the linearizer will go through the process outlined above during each linearization. In other words, the segments representing the characteristic are followed to the point representing the value of the variable each time the variable is measured.

It will be understood that the present invention may be embodied in a system which does not employ a dual slope ADC. For example, it may be utilized to linearize any digital pulse train which appears during a particular period defined by the period between when the pulses are first received and the time when the reset signal is received on line 78.

In the linearizer of FIG. 3 the several elements shown in block diagram form represent well known circuits for accomplishing the functions described for those elements. Thus, for example, the counters 110 and 164 which comprise a series of interconnected flip-flops with the interconnections being such as to provide normal ripple-through counters may be made up of four of the 4-bit binary counters presently produced by Texas Instruments, Inc. under the catalog number SN7493. Similarly, the segment length selector 120 may be provided by using a Texas Instruments unit catalog number SN74153 in which case only half of that dual 4-line-to-1 Data Selector is used.

The read-only memory 170 may be formed with a Signetics unit catalog number 8223 which is a 256-bit-Bipolar Field Programmable Read Only Memory.

The binary rate multiplier 100 of FIG. 3 may be a Texas Instruments unit catalog number SN7497.

I claim:

1. A digital signal linearizer comprising:
a programmable pulse rate multiplier for receiving an input pulse train whose total pulse count represents the value of a particular variable and has a non-linear relationship to the value of said variable, said multiplier being operable in accordance with a control signal to produce from said input pulse train an output pulse train at an instantaneous pulse rate which is a predetermined multiple of the instantaneous pulse rate of said input pulse train, and a counter-decoder operable to count the pulses of said input train and supply in response to the progression of said count through successive predetermined ranges to the total count a control signal for each of said ranges for programming said multiplier to provide over each of the ranges a predetermined linear relationship between the number of pulses supplied to the output train and the corresponding change in value of said variable, said counter-decoder including:

a first resettable binary counter for counting the pulses of said input pulse train and for producing on the output lines from its separate stages binary states representing the selectable spans of said successive ranges following the reset of said first counter, gating means for selectively gating signals from said output lines in response to gating signals to select said successive ranges, a second binary counter reset simultaneously with said first counter and operable to count said gated signals for producing on the output lines from its separate stages a binary address indicative of the count of the number of said successive ranges following reset passed by the input pulse train, and decoding means connected to the output lines of said second counter and responsive to said binary address to produce said gating signal on output lines to said gating means for selecting said successive ranges and to produce said control signal for each of said successive ranges as required to establish the necessary multiple for said pulse rate multiplier to provide said desired predetermined linear relationships over each of said ranges.

2. A system for producing a digital output which is a linear function of a variable measured by analog means which produces an analog signal having a non-linear relationship to said variable, comprising:

a dual slope analog to digital converter having means for gating its clock pulses through a linearizer to a counter during the measuring portion of its conversion period, said linearizer including:

a programmable pulse rate multiplier for receiving said pulses at its input and producing from said input pulses, output pulses at an instantaneous pulse rate which is a predetermined multiple of the instantaneous pulse rate of said input pulses, said rate being determined by a control signal input to said multiplier, and a counter-decoder operable to count said input pulses during said measuring period and supply in response to the progression of said count through successive predetermined ranges to the total count accumulated during said measuring period a control signal for each of said ranges for programming said multiplier to provide over each of the ranges a predetermined linear relationship between the number of pulses supplied as output pulses and the corresponding change in value of said variable, said counter-decoder including:

a first resettable binary counter for counting the input pulses and for producing on the output lines from its separate stages binary states representing the selectable spans of said successive ranges following the reset of said first counter, additional gating means for selectively gating a signal from one of said output lines in response to a gating signal to select said successive ranges, a second binary counter reset simultaneously with said first counter and responsive to count said gated signals for producing on the output lines from its separate stages a binary address indicative of the count of the number of said successive ranges following reset passed by the number of input pulses received, and decoding means connected to the output lines of said second counter and responsive to said binary address to produce said control signal for each of said successive ranges as required to establish the necessary multiple for said pulse rate multiplier to provide said desired predetermined linear relationship over each of said ranges and to produce said gating signal on output lines to said additional gating means for selecting said successive ranges.

* * * * *